United States Patent [19]
Nakasuji

[11] Patent Number: 5,977,550
[45] Date of Patent: Nov. 2, 1999

[54] CHARGED-PARTICLE-BEAM OPTICAL SYSTEMS

[75] Inventor: Mamoru Nakasuji, Yokohama, Japan

[73] Assignee: Nikon Corporation, Tokyo, Japan

[21] Appl. No.: 09/069,712

[22] Filed: Apr. 29, 1998

[30]     Foreign Application Priority Data

Apr. 30, 1997   [JP]   Japan .................................... 9-124721

[51] Int. Cl.$^6$ .................................................. H01J 37/00
[52] U.S. Cl. .................................... 250/492.2; 250/396 R
[58] Field of Search ........................... 250/492.2, 396 R, 250/398

[56]              References Cited

U.S. PATENT DOCUMENTS 5,770,863   6/1998  Nakasuzi ............................... 250/442.2

OTHER PUBLICATIONS

Waskiewicz et al., "Electron–Optical Design for the Scalpel Proof–of–Concept Tool," *SPIE* 2522:13–22 (1995).

*Primary Examiner*—Kiet T. Nguyen
*Attorney, Agent, or Firm*—Klarquist Sparkman Campbell Leigh & Whinston, LLP

[57]              ABSTRACT

Charged-particle-beam optical systems are disclosed for transferring patterns from a mask to a wafer using a charged-particle beam ("CPB"). In an embodiment, a mask-illumination lens system forms a demagnified image of an illumination aperture on a mask subfield. A first and a second projection lens receive the CPB from the crossover and form a demagnified image of the selected subfield on the wafer. One or more deflectors are provided to deflect the CPB to the selected mask subfield. A magnetic field satisfying conditions of a moving objective lens or a variable axis lens is provided by a deflector so that a principal ray from the illumination aperture to the mask subfield coincides with an effective optical axis produced by the deflector. The focal lengths of the mask-illumination lens system and the first projection lens satisfy conditions so that the CPB optical system is compact.

20 Claims, 1 Drawing Sheet

CHARGED-PARTICLE-BEAM OPTICAL SYSTEMS

FIELD OF THE INVENTION

The invention pertains to charged-particle-beam optical systems for transferring patterns from a mask to a wafer using a charged-particle beam.

BACKGROUND OF THE INVENTION

Charged-particle-beam ("CPB") pattern-transfer apparatus have been developed for transferring patterns from a mask to a sensitized substrate, typically a semiconductor wafer that is coated with a thin layer of a suitable resist. One such apparatus using an electron beam is described in Japanese Kokai patent document no. Hei 5-160012. This apparatus illuminates a mask with an electron beam and then forms a demagnified image of patterns on the mask on a sensitized wafer using a two-stage projection lens.

Electron-beam optical systems exhibit unacceptable levels of aberrations when used to illuminate large fields. Therefore, a pattern from an entire mask cannot be transferred to the wafer in a single exposure using such an optical system. Instead, the mask is divided into a plurality of small "subfields" and the pattern portion defined by each subfield is sequentially transferred to the wafer. One system that transfers subfields in this manner is described in U.S. Pat. No. 5,260,151, incorporated herein by reference.

In CPB pattern-transfer apparatus in which the mask is divided into subfields, the lens downstream of the mask generally has a focal length that is approximately equal to the focal length of a condenser lens that focuses the CPB on the subfield. If these two focal lengths are approximately equal, then spherical aberration is reduced. In addition, a simple lens design can be used for both lenses. However, if these two lenses have approximately equal focal lengths, then the distance from the CPB source (e.g., an electron gun) to the wafer tends to be long and the CPB pattern-transfer apparatus tends to be correspondingly large. In some cases, the apparatus is too large to fit inside an ordinary clean room.

These apparatus generally limit the mask area illuminated by the CPB to a selected subfield by trimming the CPB using an aperture to appropriately limit the transverse area of the CPB. The aperture defines an illumination region that is projected onto the mask with a magnification greater than unity. Because an enlarged image of the aperture is projected onto the selected subfield, the aperture must be small. The manufacture of an aperture plate defining a small aperture is difficult. In addition, the edges of the aperture plate receive intense illumination by the CPB causing large temperature variations. These large temperature variations cause unacceptable thermal variations in the dimensions of the aperture.

In addition, in conventional CPB pattern-transfer apparatus, the CPB propagates through the optical system at different angles for on-axis and off-axis mask subfields. This leads to increased aberrations that are especially serious for off-axis subfields.

SUMMARY OF THE INVENTION

An object of the present invention is to provide a more compact charged-particle-beam (CPB) optical system.

A further object of the invention is to provide a CPB optical system that demagnifies the illumination aperture onto the mask, thereby simplifying manufacture of the aperture plate.

Another object of the invention is to provide a CPB optical system in which the angle at which the CPB propagates with respect to the optical axis is approximately the same for on-axis and off-axis subfields.

In fulfillment of the stated objects, CPB optical systems for projecting a pattern from a subfield of a mask onto a wafer or other substrate are provided. A preferred embodiment of such an optical system comprises a charged-particle source that produces a chargedparticle beam, and a condenser lens system that receives the charged-particle beam. The condenser lens adjusts the current density of the charged-particle beam. The system further comprises an aperture plate that defines an illumination aperture. The condenser lens systems illuminates the illumination aperture with the chargedparticle beam and a mask-illumination lens system images the illumination aperture onto a selected mask subfield.

A first subfield-selection deflector directs the charged-particle beam to the selected subfield and a second subfield-selection deflector directs the chargedparticle beam parallel to the system axis after transmission by a blanking aperture (situated downstream of the illumination aperture).

The optical system further comprises a first projection lens that receives the charged-particle beam from the selected mask subfield and forms a CPB crossover. A second projection lens receives the charged-particle beam from the crossover and forms a demagnified image of the selected mask subfield on the wafer.

The focal length of the mask-illumination lens system is preferably less than the focal length of the first projection lens. In a first exemplary configuration, the focal length of the mask-illumination lens system is less than or equal to ½(half) the focal length of the first projection lens. In a second exemplary configuration, the focal length of the mask-illumination lens system is less than or equal to ⅓ the focal length of the first projection lens. In a third exemplary configuration, the focal length of the mask-illumination lens system is less than or equal to ¼ the focal length of the first projection lens. In a fourth exemplary configuration, the focal length of the mask-illumination lens system is less than or equal to ½ the focal length of the first projection lens and greater than or equal to ⅕ the focal length of the first projection lens.

The CPB optical system preferably also comprises an axis-shifting deflector that establishes an effective optical axis laterally shifted from the system axis and a deflection controller connected to and that is operable to control the axis-shifting deflector. The axis-shifting deflector is preferably operable so that an off-axis principal ray coincides with the effective optical axis between the illumination aperture and the mask.

The condenser lens system can comprise two lenses and is operable to adjust the current density or illumination uniformity at the illumination aperture.

In an exemplary embodiment, an electron-beam optical system, according to the invention, comprises an electron gun that produces an electron beam, and a condenser lens system that adjusts the current density of the electron beam. An aperture plate defines an illumination aperture that is illuminated by the condenser lens system. A heat sink is situated gun-wise of the aperture plate to reduce heating of the aperture plate. A blanking aperture and a blanking deflector selectably blank the electron beam. A mask-illumination lens system images the illumination aperture onto the mask; a subfield-selection deflector system directs the image of the illumination aperture to a selected mask subfield and directs the electron beam parallel to the axis after transmission by the selected mask subfield.

An axis-shifting deflector produces a magnetic field satisfying VAL or MOL conditions with respect to the mask-illumination lens. Thus, the axis-shifting deflector establishes an effective optical axis so that, between the illumination aperture and the mask, an offaxis principal ray coincides with the effective optical axis.

The foregoing and other features and advantages of the invention will become more apparent from the following detailed description that proceeds with reference to the accompanying drawing.

DETAILED DESCRIPTION

Figure 1:
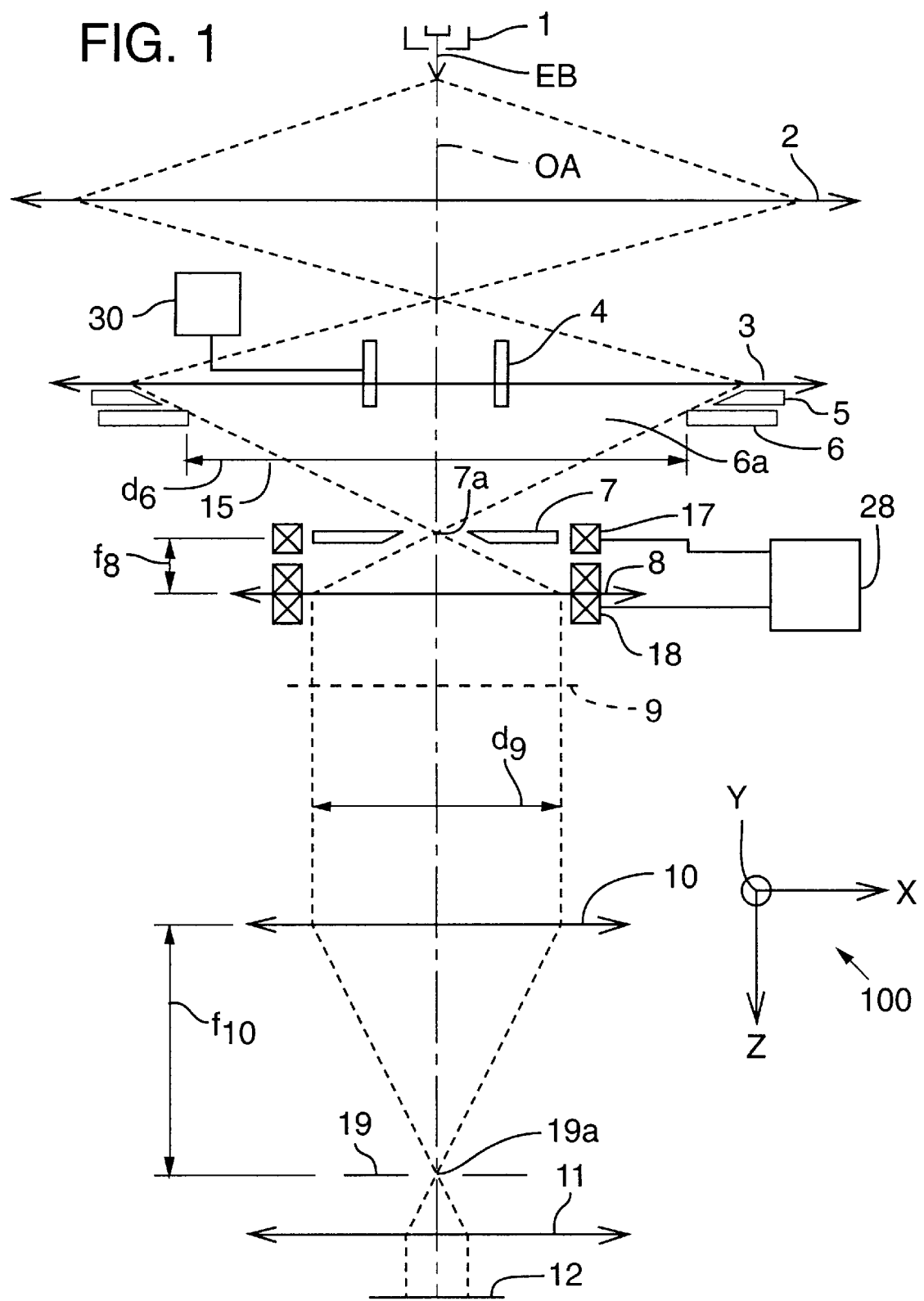
FIG. 1 is an elevational sectional view of a charged-particle-beam optical system according to an example embodiment of the invention.

For convenience in describing embodiments of the invention, distances along an optical axis closer to a charged-particle-beam (CPB) source are referred to as "gun-wise"; distances closer to a substrate on which a mask image is projected are referred to as "image-wise." A mask subfield that does not intersect an optical axis is referred to as "off-axis." A principal ray is a path of a charged particle from an object to an image and passing through the center of an aperture stop and perpendicular to the aperture stop.

With reference to FIG. 1, an example embodiment of an optical system for a CPB pattern-transfer apparatus comprises an electron gun 1 (as a representative CPB source) that directs an electron beam EB along an optical axis OA. The optical axis OA is parallel to a z-axis of an xyz coordinate system 100. First and second condenser lenses 2, 3, respectively, receive the electron beam EB from the electron gun 1 and form a beam crossover 7a at a blanking aperture 7. The condenser lenses 2, 3 are collectively operable as a zoom lens to adjust the current density of the electron beam EB.

A blanking deflector 4 is situated to deflect the electron beam EB when the blanking deflector 4 is activated by a controller 30. If deflected by the blanking deflector 4, the electron beam EB is deflected to and blocked by the blanking aperture 7.

A heat sink 5 and a rectangular aperture plate 6 are situated along the optical axis OA image-wise of the condenser lens 3. The aperture plate 6 defines a rectangular illumination aperture 6a having an illustrative dimension $d_6$. The aperture plate 6 is illuminated by the electron beam EB as adjusted by the condenser lenses 2, 3. The aperture plate 6 limits the electron beam EB so that only a selected subfield of the mask 9 is illuminated. The heat sink 5 is situated gun-wise of the aperture plate 6 to reduce heating of the aperture plate 6 by the electron beam EB. The heat sink intercepts a portion of the electron beam EB that would otherwise reach the aperture plate 6, reducing electron-beam heating of the aperture plate 6. Reduced heating of the aperture plate 6 reduces dimensional variations in the aperture plate 6 (such as variations in $d_6$) caused by thermal expansion and contraction.

A first subfield-selection deflector 17 is situated image-wise of the aperture plate 6 along the optical axis OA at the blanking aperture 7. A mask-illumination lens 8 having a focal length $f_8$, and a second subfield-selection deflector 18 are situated image-wise of the deflector 17. The mask-illumination lens 8 collimates the electron beam EB received from the crossover 7a and directs the electron beam EB to the mask 9, imaging the illumination aperture 6a onto a selected subfield of the mask 9 with a demagnification 1/M, where M=2 in this embodiment. The subfield-selection deflectors 17, 18 direct the electron beam EB to the selected subfield as directed by a subfield-selection controller 28.

Illumination of a single subfield is illustrated in FIG. 1, but the mask 9 extends in an xy-plane and generally contains a plurality of subfields, many of which do not intersect the optical axis OA. An off-axis subfield is selected by deflecting the electron beam EB away from the optical axis OA using the first subfield-selection deflector 17. After the electron beam EB is transmitted by the mask, the second subfield-selection deflector 18 redirects the electron beam parallel to the optical axis OA. Because the deflected electron beam EB does not propagate along the optical axis OA of the mask-illumination lens 8, images formed by the mask-illumination lens 8 exhibit off-axis lens aberrations. Because the mask-illumination lens 8 has a short focal length (i.e., $f_8$ is small), even small increases in the angle of propagation of the electron beam EB with respect to the optical axis OA can significantly increase aberrations in the image of the illumination aperture 6a.

These additional aberrations are prevented or reduced using the second subfield-selection deflector 18. In addition to redirecting the electron beam EB before illumination of the selected mask subfield, the second subfield-selection deflector 18 is arranged with the mask-illumination lens 8 to satisfy moving objective lens ("MOL") or variable axis lens ("VAL") conditions. The second subfield-selection deflector 18 establishes an effective optical axis by supplying a magnetic field according to the MOL or VAL conditions. The electron beam EB then propagates along the effective optical axis displaced or tilted with respect to the optical axis OA, and the mask-illumination lens 8 exhibits aberrations corresponding to aberrations for on-axis imaging. Because the second subfield-selection deflector establishes an effective optical axis, the deflector is referred to as an "axis-shifting" deflector. A separate beam deflector and axis-shifting deflector can be substituted for the second subfield-selection deflector 18.

The VAL magnetic field provided by the second subfield-selection deflector 18 has a radial component proportional to the product of the first derivative of the axial magnetic field $B_z$ of the mask-illumination lens 8 with respect to the axial coordinate z and a radial distance r from the optical axis OA. This magnetic field component establishes an effective optical axis at the radial distance r from the optical axis OA. A principal ray from the illumination aperture 6a to the mask 9 coincides with the effective optical axis between the illumination aperture 6a and the mask 9; the principal ray is preferably perpendicular to both the mask 9 and the illumination aperture 6a.

As shown in FIG. 1, the selected mask subfield is illuminated by the electron beam EB. A projection lens having a focal length $f_{10}$ and an objective lens 11 are situated image-wise of the mask 9. The projection lens 10 forms a crossover 19a of the electron beam EB at a crossover aperture plate 19. The lens 11 receives the electron beam EB from the crossover 19a and forms a demagnified image of the selected mask subfield on a corresponding "transfer subfield" on the sensitized substrate 12. The sensitized substrate 12 is generally a semiconductor wafer coated with a suitable CPB-sensitive resist.

As shown in FIG. 1, the focal length $f_8$ of the mask-illumination lens 8 is preferably less than the focal length $f_{10}$ of the projection lens 10. For example, $f_8 \leq f_{10}/2$, or $f_8 \leq f_{10}/3$, or $f_8 \leq f_{10}/4$. Superior results are obtained if $f_{10}/5 \leq f_8 \leq f_{10}/2$. The axial distance between the electron gun 1 and the mask 9 is approximately equal to the axial distance between the mask 9 and the wafer 12. For example, if the mask-wafer distance is 80 cm for $f_8 \approx f_{10}/2$, the electron gun-wafer distance is approximately 1.5 m. A CPB optical system having such a length fits easily into a clean room.

In addition, the mask-illumination lens 8 projects a demagnified image of the illumination aperture 6a onto the mask 9. The demagnification factor is determined as required by the ratio of the dimension $d_6$ of the illumination aperture 6a to a corresponding subfield dimension $d_9$.

Because the second subfield-selection deflector 18 satisfies MOL or VAL conditions, the deflector establishes an effective optical axis of the mask-illumination lens 8 that coincides with a principal ray from the selected mask subfield. The crossover 19a and the image of the illumination aperture 6a exhibit reduced aberrations and these aberrations tend to be similar for on-axis and off-axis subfields.

By providing a projection lens 10 and a mask-illumination lens 8 such that $f_8 \leq f_{10}$, the gun-mask distance is reduced and the total length of the CPB pattern-transfer apparatus is reduced. By demagnifying the illumination aperture 6a onto the mask 9, manufacture of the aperture plate 6 is simplified. Providing MOL or VAL magnetic fields permits short focal lengths to be used while maintaining image quality for off-axis subfields.

While an electron-beam optical system is used to describe an embodiment of the invention, charged particles other than electrons can be used. For example, ions can be used. In addition, the term "lens" as used herein is not restricted to a single lens element but encompasses multi-element lenses or lens systems.

Having illustrated and demonstrated the principles of the invention in a preferred embodiment, it should be apparent to those skilled in the art that the preferred embodiment can be modified in arrangement and detail without departing from such principles. I claim as the invention all that comes within the scope of the following claims.

What is claimed is:

1. A charged-particle-beam optical system for projecting a pattern from a subfield of a mask onto a wafer or other substrate, the system comprising along a system axis:
    a source of a charged-particle beam;
    a condenser lens system situated to receive the charged-particle beam from the source and operable to adjust a crossover location of the charged-particle beam;
    an aperture plate defining an illumination aperture and situated to receive the charged-particle beam from the condenser lens system;
    a mask-illumination lens system situated to image the illumination aperture onto a selected mask subfield;
    a first subfield-selection deflector, operable to direct the charged-particle beam to a selected subfield of the mask;
    a second subfield-selection deflector, operable to deflect the charged-particle beam transmitted by the aperture parallel to the axis;
    a first projection lens situated to receive the charged-particle beam from the selected subfield and form a charged-particle-beam crossover, the first projection lens having a focal length; and
    a second projections lens situated to receive the charged-particle beam from the crossover and form a demagnified image of the selected subfield on the wafer, wherein the mask-illumination lens system has a focal length that is less than the focal length of the first projection lens.

2. The charged-particle-beam optical system of claim 1, wherein the focal length of the mask-illumination lens system is less than or equal to ½ the focal length of the first projection lens.

3. The charged-particle-beam optical system of claim 1, wherein the focal length of the mask-illumination lens system is less than or equal to ⅓ the focal length of the first projection lens.

4. The charged-particle-beam optical system of claim 1, wherein the focal length of the mask-illumination lens system is less than or equal to ¼ the focal length of the first projection lens.

5. The charged-particle-beam optical system of claim 1, wherein the focal length of the mask-illumination lens system is less than or equal to ½ the focal length of the first projection lens, and greater than or equal to ⅕ the focal length of the first projection lens.

6. The charged-particle-beam optical system of claim 1, further comprising:
    an axis-shifting deflector situated to establish an effective optical axis between the illumination aperture and the mask; and
    a deflection controller, connected to and operable to control the axis-shifting deflector.

7. The charged-particle-beam optical system of claim 6, wherein the focal length of the mask-illumination lens system is less than or equal to ½ the focal length of the first projection lens.

8. The charged-particle-beam optical system of claim 6, wherein the focal length of the mask-illumination lens system is less than or equal to ⅓ the focal length of the first projection lens.

9. The charged-particle-beam optical system of claim 6, wherein the focal length of the mask-illunination lens system is less than or equal to ¼ the focal length of the first projection lens.

10. The charged-particle-beam optical system of claim 6, wherein the focal length of the mask-illumination lens system is less than or equal to ½ the focal length of the first projection lens and greater than or equal to ⅕ the focal length of the first projection lens.

11. The charged-particle-beam optical system of claim 1, wherein the condenser system comprises two lenses and is operable to adjust the current density or illumination uniformity at the illumination aperture.

12. The charged-particle-beam optical system of claim 11, wherein the focal length of the mask-illumination lens system is less than or equal to ½ the focal length of the first projection lens.

13. The charged-particle-beam optical system of claim 11, wherein the focal length of the mask-illumination lens system is less than or equal to ⅓ the focal length of the first projection lens.

14. The charged-particle-beam optical system of claim 11, wherein the focal length of the mask-illumination lens system is less than or equal to ¼ the focal length of the first projection lens.

15. The charged-particle-beam optical system of claim 11, wherein the focal length of the mask-illumination lens system is less than or equal to ½ the focal length of the first projection lens and greater than or equal to ⅕ the focal length of the first projection lens.

16. The charged-particle-beam optical system of claim 1, wherein the illumination aperture is demagnified onto the mask.

17. The charged-particle-beam optical system of claim 16, wherein the focal length of the mask-illumination lens system is less than or equal to ⅓ the focal length of the first projection lens.

18. The charged-particle-beam optical system of claim 16, wherein the focal length of the mask-illumination lens system is less than or equal to ¼ the focal length of the first projection lens.

19. The charged-particle-beam optical system of claim 16, wherein the focal length of the mask-illumination lens system is less than or equal to ½ the focal length of the first projection lens and greater than or equal to ⅕ the focal length of the first projection lens.

20. An electron-beam optical system for a charged-particle-beam pattern-transfer apparatus that transfers patterns from a subfield of a mask to a sensitized wafer, the system comprising:

an electron gun that produces an electron beam;

a condenser lens system situated to receive the electron beam from the electron gun and adjust the crossover position of the electron beam;

an aperture plate defining an illumination aperture, the aperture plate receiving the electron beam from the condenser lens system;

a heat sink situated gun-wise of the aperture plate;

a blanking aperture and a blanking deflector, situated to receive the electron beam from the illumination aperture and selectably blank the electron beam;

a mask-illumination lens system that forms an image of the illumination aperture on the mask;

a subfield-selection deflector system situated to direct the image of the illumination aperture to a selected subfield and direct the electron beam parallel to a system axis after transmission by the blanking aperture;

an axis-shifting deflector operable to produce a magnetic field satisfying VAL or MOL conditions with respect to the mask-illumination lens and establishing an effective optical axis, whereby an off-axis principal ray coincides with the effective optical axis between the illumination aperture and the mask.

* * * * *